United States Patent [19]

Anderson

[11] 4,396,806
[45] Aug. 2, 1983

[54] HEARING AID AMPLIFIER

[76] Inventor: Jared A. Anderson, 140 Sunrise Dr., Woodside, Calif. 94052

[21] Appl. No.: 198,677

[22] Filed: Oct. 20, 1980

[51] Int. Cl.³ ............................................. H04R 25/00
[52] U.S. Cl. ............................. 179/107 FD; 179/1 A; 179/1 VL
[58] Field of Search ............................. 330/126, 279; 179/107 R, 107 FD, 1 A, 1 VL

[56] References Cited

U.S. PATENT DOCUMENTS

| 3,229,049 | 1/1966 | Goldberg | 179/107 FD |
| 3,894,195 | 7/1975 | Kryter | 179/107 FD |
| 4,079,334 | 3/1978 | Hamilton | 330/279 |

FOREIGN PATENT DOCUMENTS

| 2737466 | 2/1979 | Fed. Rep. of Germany | 330/279 |
| 54-149452 | 11/1979 | Japan | 330/279 |

OTHER PUBLICATIONS

W. Cole; "Present and Future Developments in Hearing Aid Design"; Hearing Instruments; May 1979; pp. 16–19; 179–107 R.
S. Mangold & A. Leijon; "Programmable Hearing Aid with Multichannel Compression"; Scand Audiol 8; No. 2; 1979; pp. 121–126.

Primary Examiner—G. Z. Rubinson
Assistant Examiner—Randall P. Myers
Attorney, Agent, or Firm—Townsend & Townsend

[57] ABSTRACT

A general purpose hearing aid amplifier is programmably adaptable to the prescription requirements of the hearing impaired. The hearing aid amplifier comprises a bank of bandpass-restricted channels, each channel having a voltage-controlled input amplifier, a voltage-controlled compressor, and a voltage-controlled output amplifier for shaping the gain, attack and delay characteristics of the selected channel. The bank is fed through a fixed high-pass filter from a microphone input, and a mixed output drives a power amplifier for an output transducer such as a hearing aid speaker. The amplifier is programmably adaptable through the use of a monolithic programmable switch array using, for example, semiconductor fuseable link technology to preset digital-to-analog converters voltage controllable levels of the amplifiers and compressors of each channel according to a digital control input. The monolithic switch array is coupled to the programmable amplifiers through digital to analog converters which establish the programming voltages for the amplifiers and compressors. The monolithic switch array digital to analog converters may be constructed on the same monolithic semiconductor chip.

6 Claims, 4 Drawing Figures

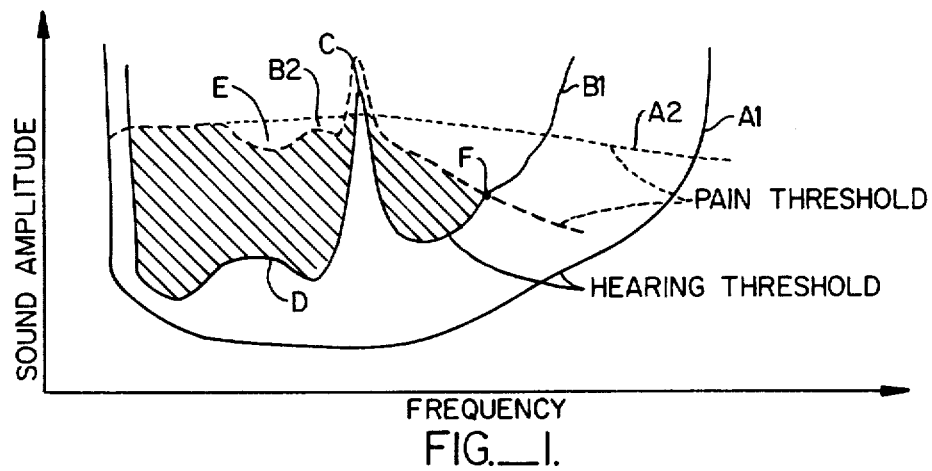
FIG._1.
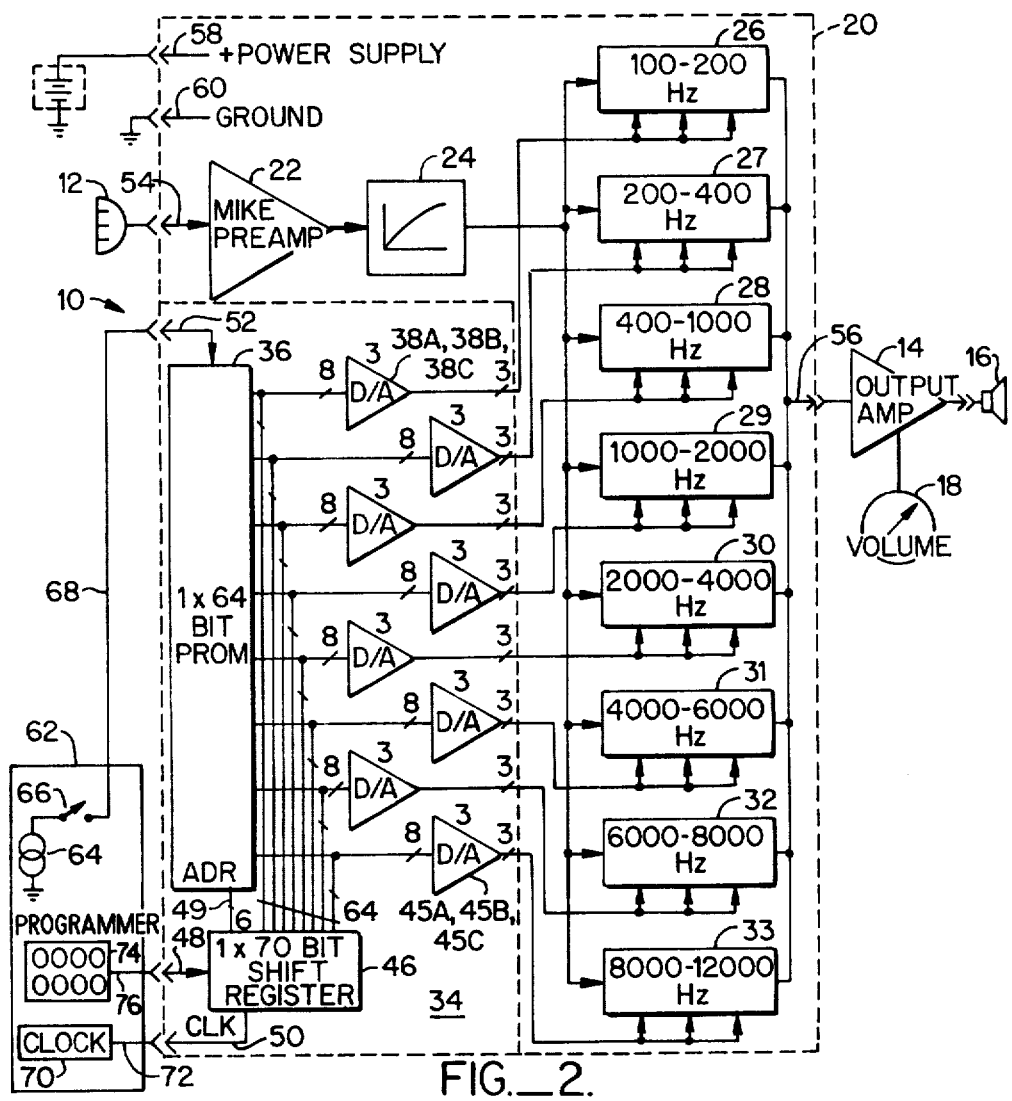
FIG._2.

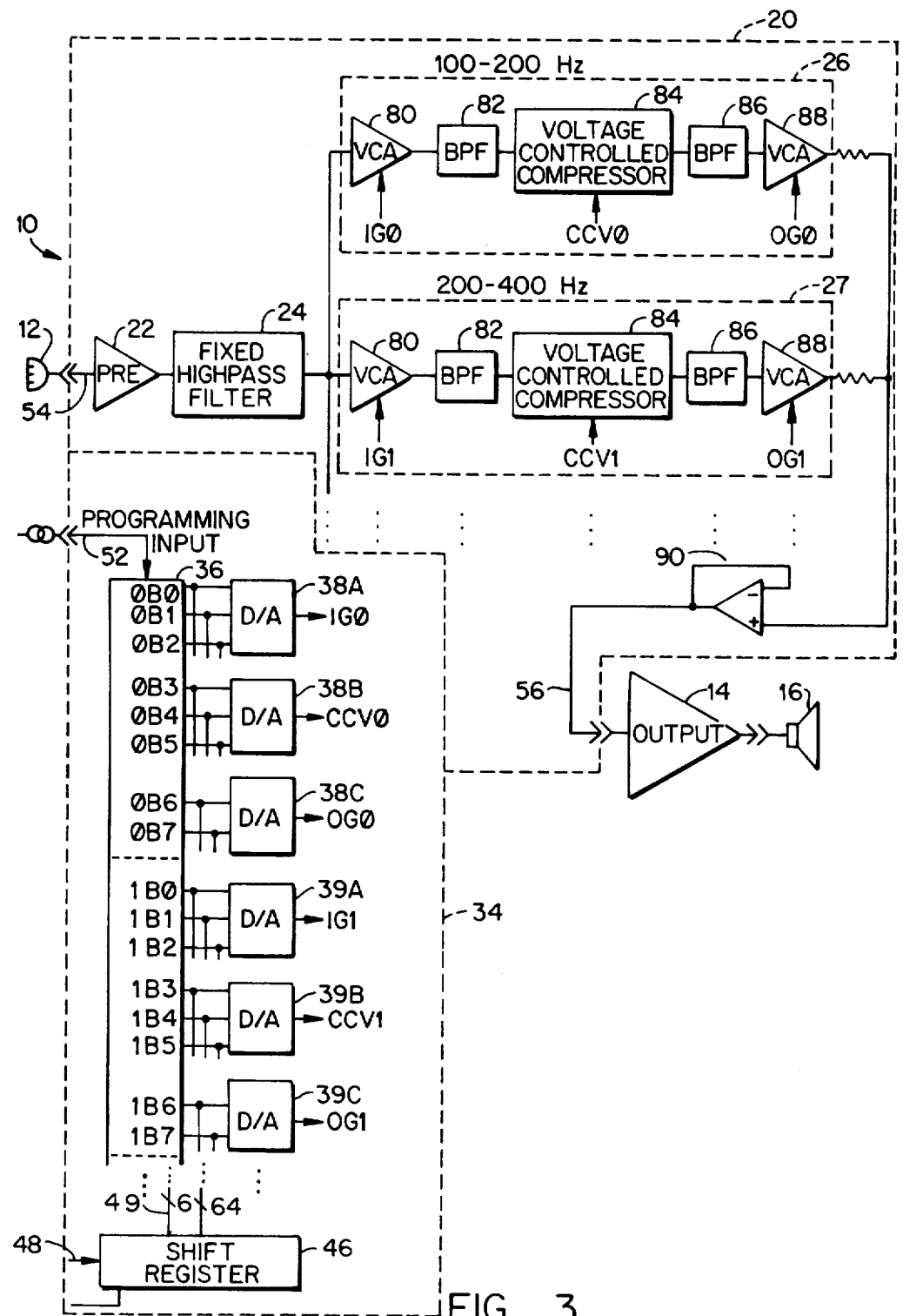
FIG._3.

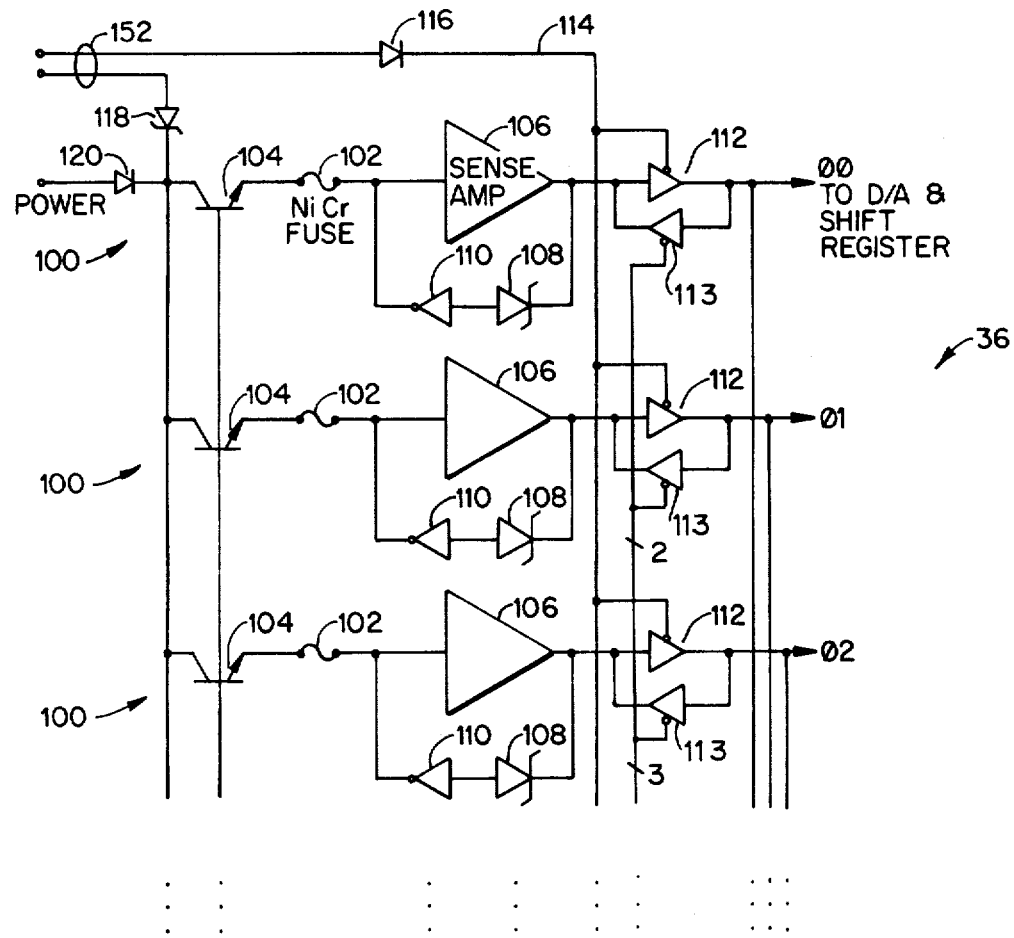
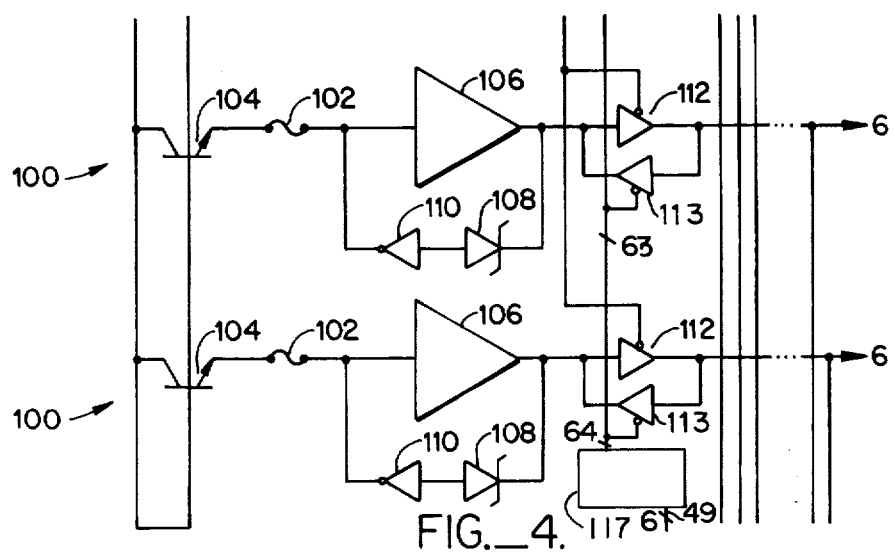
FIG._4.

HEARING AID AMPLIFIER

BACKGROUND OF THE INVENTION

1. Field of Invention

This invention relates to hearing aids for the aurally impaired. Specifically, the invention relates to a hearing aid which is readily customized to the specific hearing characteristics and prescription requirements of the hearing impaired.

The quality and characteristics of hearing are very much like sight in that differences exist between individuals depending on the age and condition of the sensory organ. Significant advances have been in the optical arts to enable an individual to obtain corrective lenses specific to prescription requirements based on actual measurements of the quality of sight. A fitting of eyeglasses or other corrective lenses, for example, typically involves the testing of easily controlled optical parameters with actual corrective lenses having the specified characteristics. The user may therefore personally judge the quality and operability of the precise prosthetic prior to final acceptance.

In the present state of the hearing aid art, considerably less control and flexibility is available to the hearing impaired user. Few parameters controlling the various characteristics of the hearing aid amplifier are readily controlled. Typically, a hearing aid amplifier consists of one or two stages of amplification with some frequency response shaping intended as a compromise for generally encountered hearing impairments. Little, if any, attention is given to the specific characteristics of hearing of the individual in need of a prosthetic.

There is therefore a need for a new type of hearing aid which can be specifically and interactively adapted to the hearing characteristics of individuals having hearing impairments.

2. Description of the Prior Art

Tuned amplifiers are well-known to the electrical arts. Frequency-domain, band-limited controllable equalizers and compressors are also known. However, none is known which is of sufficiently small size and portability to be incorporated into a hearing aid. Wiring interconnections, power considerations, need for access to control elements, and the specialized needs of the hearing impaired have in the past suggested that miniature sound amplifiers with a large number of control variables is impractical for hearing aid applications. Accordingly, there has been no known effort to provide a low-cost, easily programmable hearing aid amplifier.

SUMMARY OF THE INVENTION

According to the invention a programmable hearing aid amplifier is provided which includes a multiple band preamplifier with controllable gain and compression characteristics and a programmable switch array for interactively defining the controllable characteristics of the preamplifier. The preamplifier signal is fed to a power amplifier which may drive a hearing aid transducer such as a hearing aid speaker.

The hearing aid preamplifier comprises a bank of bandpass-restricted channels, each channel having a voltage-controlled input amplifier, a voltage-controlled compressor, and a voltage-controlled output amplifier coupled in series for shaping the gain, attack and delay characteristics of the selected channel. The bank is fed through a fixed highpass filter through a microphone input and the various outputs are mixed and fed through a final power amplifier which may have a standard volume control for an output transducer such as a hearing aid speaker.

In addition, a digital programming unit is provided for generating voltage controls for the sub-elements of the amplifier. The programming unit comprises a monolithic programmable switch array using semiconductor fuseable link technology. The switch array is coupled through digital-to-analog converters which convert a digital level to an analog voltage which drives the voltage-controlled amplifier and compressors of each channel in the bank of preamplifiers. Programming is accomplished through a connector plug which gives access to digital input terminals of the programmable array. The connector plug may be coupled to a simple programming unit and be tied to the respective leads between the programmable digital array and specific digital-to-analog converter circuits. A programming unit consisting essentially of bypass switches external of the circuit may be coupled to the amplifier subcircuits. The bypass switches may be used to preprogram the bank of amplifiers without physically modifying the circuit in order to test linear circuit response directly and interactively according to the tastes of the potential user. Once the amplitude and frequency response best suited to the user have been determined, the programmable switch array can be permanently preset to the desired switch setting established by the bypass switches. A consequence is a universal hearing aid with an input-output sound transfer function which can be specifically customized to individual taste.

BRIEF DESCRIPTION OF THE DRAWINGS

FIG. 1 is a diagram showing amplitude versus frequency graph of the hearing characteristics of two different individuals.

FIG. 2 is a block diagram of a hearing aid amplifier according to the invention.

FIG. 3 is a schematic diagram illustrating two channels of a device according to the invention of FIG. 2.

FIG. 4 is a schematic diagram of a programmable switch array according to the invention of FIG. 2.

DETAILED DESCRIPTION OF PREFERRED EMBODIMENTS

As an aid to understanding the problem of the hearing impaired, it is helpful to examine typical hearing characteristics. FIG. 1 is a diagram illustrating the hearing characteristics of two typical individuals. The diagram illustrates the levels of sound amplitude which can be detected by the ear at frequencies between 0 and approximately 15,000 Hz. The areas bounded by the curves A1 and A2 indicate the hearing range of an individual having nominally good hearing. The lower curve A1 represents the hearing threshold, or the level of sound which an individual can first detect. The curve A2 is the pain threshold, or the level of sound above which causes noticeable pain or discomfort to the individual. As will be noted, the hearing threshold and the pain threshold vary with frequency.

The area bounded by curves B1 and B2 represent the hearing range of an individual who has impaired hearing. The curve B1 is the hearing threshold, and the curve B2 is the pain threshold. As will be noted, the hearing threshold of a hearing impaired is typically considerably higher than the hearing threshold of an individual having nominally good hearing. This is the so-called loss of hearing characteristic. Under certain conditions, an individual may lose hearing at specific frequencies, for example, as caused by extended exposure to intense sound at selected frequencies. This characteristic is illustrated by the point C and adjacent areas in the hearing threshold curve B1. Other hearing impairments may be age-related or hereditary which not only reduce the hearing threshold but also reduce the dynamic range of hearing. This case is illustrated by the area D of curve B1 wherein the hearing threshold is changed, and by area E of curve B2 wherein the threshold of pain is reduced. The region between areas D and E represent the maximum dynamic range of sound which the individual can comfortably tolerate.

It will also be noted that an individual may be able to hear sounds at high frequency levels having an amplitude well above the pain threshold. This condition is illustrated by the area on curve B1 higher than point F. Sounds with amplitudes in the range between the curves B2 and A2 within the hearing range of the hearing impaired can cause extreme discomfort. Heretofore, hearing aids have not been produced or made generally available which have a characteristic sound transfer function capable of compensating for the sorts of hearing impairments illustrated by curves B1 and B2. For example, a typical hearing aid attempting to boost sounds falling within the normal hearing threshold above the threshold of hearing or hearing impaired individual may also amplify sounds of relatively high level to levels beyond the threshold of pain for the hearing impaired individual. Such a condition is unacceptable. For this reason many hearing impaired individuals prefer to cope directly with their hearing impairment rather than to tolerate pain and discomfort caused by the hearing aid.

FIG. 2 presents the block diagram of a hearing aid which is capable of addressing many of the problems heretofore described. A hearing aid 10 according to the invention comprises an input microphone transducer 12 and an output power amplifier 14 coupled to an output transducer such as a hearing aid speaker 16 wherein the microphone transducer 12 is coupled to the output amplifier 14 through a device according to the invention which may be descriptively termed a miniature multiple-band programmable signal compressor and preamplifier, or simply a miniature preamplifier chip 20. Signals from the microphone transducer 12 to the output amplifier 14 are directed on the following path. A signal from the microphone transducer 12 is provided to an wideband microphone preamplifier 22 the output of which is provided to a fixed high-pass filter 24. The output of the high-pass filter 24 is applied in parallel to the inputs of a plurality of frequency band-limited channels 26–33. The channels each provide selectable amplitude and delay shaping within a preselectable amplitude range. The outputs of the band-limited channels 26–33 are mixed into a single output signal, possibly in a buffer (not shown), and fed to the input terminal of the output amplifier 14. The output amplifier 14 has an external volume control 18 as is conventional in hearing aids generally.

The band-limited channels 26–33 according to the invention are substantially identical except for the frequency range of operation. These ranges might be 100 to 200 Hz for the first channel 26, 200 to 400 Hz for the second channel 27, 400 to 1000 Hz for the third channel 28, 1000 to 2000 Hz for the fourth channel 29, 2000 to 4000 Hz for the fifth channel 30, 4000 to 6000 Hz for the sixth channel 31, 6000 to 8000 Hz for the seventh channel 32 and 8000 to 12000 Hz for the eighth channel 33. Each channel 26–33 has at least three controllable input parameters which are determined by three analog signal input lines, as hereinafter explained.

The control parameters of the channels are selected by a subsystem herein termed a coefficient selector 34. The coefficient selector 34 comprises a 1×64 bit Programmable Read Only Memory (PROM) 36 having eight groupings of bits coupled to eight groups of three digital-to-analog converters 38A, 38B, 38C through 45A, 45B, 45C, and a 1×70 bit serial shift register 46 having a serial input line 48, sixty-four parallel data output lines coupled to each of the digital input lines of the digital-to-analog converters 38A, 38B, 38C through 45A, 45B, 45C and six parallel output lines as an address bus 49. The coefficient selector 34 includes as few as three external connections, namely, a serial input line 48, a clock input line 50 to the shift register 46 and a program input line 52 to the PROM 36. The entire preamplifier chip 20 employs as few as seven external terminals, namely the serial input line 40, the clock input line 50, the program input line 52, a microphone input line 54, an amplifier output line 56, a power supply 58, a ground 60. Thus, the entire preamplifier chip can be housed in a standard eight pin DIP package, octal can or miniature flat package measuring as small as 6 mm square plus lead length.

Heretofore, it has been considered impossible or impractical to provide a miniature amplifier circuit having a large number of controllable parameters, in this case twenty-four, in a system or package of a small size having substantially fewer external terminals than controllable parameters. According to the present invention, a large number of parameters can be preset with as few as five terminals (input, clock, program, power supply, and ground), the number of parameters being limited only by the length of the serial input register and the size of the memory.

The selection of parameters for the chip 20 may be effected through an externally connectable programming unit 62. The programming unit 62 has leads for connecting to the serial input line 48, the clock input line 50 and the program input line 52 of the chip 20. The programming unit 62 comprises a current source 64 coupled through a switch 66 to a program line 68 which can be connected to the chip program input line 52, a clock 70 coupled to a clock line 72 which can be coupled to the clock line 50 of the chip 20, and a switch array 74 for translating selected parameters, addresses and levels to a serial output which is fed through a digital output line 76 to the serial input line 48 of the chip 20. The switch array 74 may be a simple parallel to serial translator such as a serial output shift register which is set by manual switches.

In FIG. 3 there is shown a more detailed schematic diagram illustrating two channels of a device according to the invention. The microphone 12 is connected to the chip 20 through input 54 to the mike preamplifier 22 and fixed high-pass filter 24, as previously described. The fixed high-pass filter 24 eliminates many unuseable or undesirable low-frequency signals which contribute undesirable noise to the hearing aid 10 which would otherwise complicate signal processing. The output of the high-pass filter 24 is passed to parallel channels. In this case only first channel 26 and second channel 27 are represented.

Each channel comprises, in order, a first voltage-controlled amplifier 80, a bandpass filter 82 centered at the channel frequency, which may be for example 100 to 200 Hz first channel 26 with a center frequency at 150, and 200 to 400 Hz in second channel 27 with the center frequency at 300 Hz. Thereafter, the channel includes a voltage-controlled limiter or compressor 84 followed by a second bandpass filter 86 which in turn is followed by a second voltage-controlled amplifier 88. The outputs of the second voltage controlled amplifier 88 are mixed into a single channel, for example, at the input to a buffer amplifier 90, and fed through an output line 56 to the output amplifier 14 and thereafter to a speaker 16.

Of particular interest is the order of the circuit elements in the channels 26, 27. The first voltage-controlled amplifier 80 is operative to amplify all applied signals to a level which will characterize the channel. The bandpass filter 82 which characterizes the channel passes only those frequencies within the defined channel range and attenuates all other signals, including any distorted signals introduced by the amplifier 80 outside the channel spectrum. The output of the bandpass filter 82 is coupled to the voltage-controlled compressor 84. The compressor 84 provides the amplitude limiting function for the channel, thus minimizing the possibility that amplified sounds will cause pain to the user. The output of the compressor 84 is applied to a bandpass filter 86 which is of substantially the same design as the first bandpass filter 82 in its response characteristic to eliminate harmonic distortion or undesired effects caused by the voltage-controlled compressor 84. The output of the bandpass filter 86 is then applied to the input of a second voltage-controlled amplifier 88. The voltage-controlled amplifier 88 permits the final selection of the audio sound level in the spectrum of the channel best suited to the taste of the user. The output of the second voltage-controlled amplifier 88 is thereafter mixed with the outputs of all other channels.

In summary, the first amplifier 80 provides initial amplitude adjustment to match the characteristics of the compressor so that all input signals within the selected range of the channel are within the audio range of the listener, the second amplifier 88 provides fine control of amplitude, and the bandpass filters 82 and 86 characterize the channel. The placement of the bandpass filters 82 and 86 are selected to minimize noise caused by distortion. The levels and amplitudes of the amplifiers 80 and 88 and the compressor 84 are controlled by a voltage level.

The voltage signals for controlling the amplifiers 80 and 88 and the compressor 84 are generated by the coefficient selector 34. The heart of the coefficient selector 34 is the programmable switch array 36. In a specific embodiment, the switch array is subdivided into eight groups of three subgroups of bits. Each subgroup of bits defines a digital value for a parameter to be controlled. For example, the first group designated the 0 group may comprise eight bits, with bit storage cells numbered 0 through 2 containing binary bits defining a value to be read by digital-to-analog converter 38A. In a similar manner bit storage cells 3 through 5 contain binary bits defining the value to be read to the digital-to-analog converter 38B, and bit storage cells 6 through 7 contain two digital values to be read by digital-to-analog converter 38C. The analog output of digital-to-analog converter 38A is a voltage which is fed through a line labeled IG0 to the first amplifier 80 of the first channel 26. The output of digital-to-analog converter 38B is a voltage applied via line labeled CCV0 to the coefficient input of compressor 84. The output of digital-to-analog converter 38C is a voltage applied through a line OG0 to the parameter input of second amplifier 88 of the first channel 26. The bit storage cells corresponding to the first channel 26 may be designated conveniently 0B0, 0B1, 0B2, . . . , 0B7.

In a similar manner, bit storage cells labeled 1B0 through 1B2 are coupled to digital-to-analog converter 39A, the analog output of which is provided as a voltage on line IG1 to the parameter input of first amplifier 80 of channel 27. Bit storage cells 1B3, 1B4 and 1B5 are coupled to digital-to-analog converter 39A, the output of which is coupled as an analog voltage through line CCV1 to the parameter input of compressor 84. The bit storage cells 1B6 and 1B7 are connected to digital-to-analog converter 38C, the output of which is an analog voltage signal on line OG1 to the parameter input of second amplifier 88 of channel 27. The bit storage cells are numbered in a sequence from 0B0 through 7B7. The outputs of the digital-to-analog converters may be labeled conveniently IG0, CCV0, OG0 through IG7, CCV7 and OG7. The bit storage cells of the switch array 36 have a one for one correspondence with bit storage cells of the shift register 46. As an example, sixty-four storage cells are shown. Additional storage cells may be employed in the shift register to load into the coefficient controller 34 digital information to preset control variables which may be needed to program the switch array 36, according to the selected design for the coefficient selector 34.

In the event more external terminals are available to the coefficient selector 34, selected serial control and data input functions can be incorporated into parallel access input configurations. For example, the shift register can be eliminated by provision of sufficient external terminals to the switch array output lines 0B0 through 7B7. Ideally the entire hearing aid, with the possible exception of the speaker 16 and microphone 12 are integrated into a single package. At least the preamplifier section from the microphone preamp 22 through the buffer 90 are included on a single monolithic semiconductor chip. Alternatively, the coefficient selector 34 may be on a separate chip with direct wire connections between the digital-to-analog converters and the channels. The two units may be mounted in a hybrid package on a miniature printed circuit board together with any power amplifiers and then packaged in a single miniature container. Since a principal object of the invention is to minimize space requirements, it follows that the number of external interconnections should also be minimized, since terminals require as much or more space than circuitry in the present state of the art.

One of the more attractive technologies now available is the so-called $I^2L$ semiconductor technology, which has the characteristic of being quite low in power consumption and very amenable to integrating linear and digital circuitry on a single chip. An alternative technology is the C-MOS technology, which has the advantage of extremely low power consumption. Either of these semiconductor technologies are suitable for the intended application.

FIG. 4 is a simplified schematic diagram of a specific embodiment of a switch array 36 according to the invention. The switch array consists of individual bit storage cells 100 each comprising a fuseable link 102, such as Nichrome (NiCr) monolithic fuse, or the like, in series with the emitter of a switching transistor 104, and a sense amplifier 106. Across the sense amplifier is coupled a Zener diode 108 in series with an inverter 110. The cathode of the Zener diode 108 is coupled to the output of the sense amplifier 106. The anode of the Zener diode 108 is coupled to the input of the inverter 110, the output of which is coupled to the input of the sense amplifier 106. The output of the sense amplifier is coupled to bidirectional buffers 112 and 113, the output of buffer 112 being coupled to one of the digital-to-analog converters 38. Cells of the shift register 46 (not shown) are connected to the input of buffer 113 and also to the input of the corresponding digital-to-analog converter 38. This is an important feature because it permits the amplifier channels to be programmed externally on a temporary basis before the program is "burned in" to the PROM 36. The buffer 112 has an enabling control through a pilot control line 114 through a diode 116. The pilot control line 114 may be used for activating and deactivating the output buffers 112.

The programming buffer 113 is enabled by a PROGRAM ENABLE line from a 6 to 64 bit address decoder 117 which in turn receives an address bit pattern from the external shift register 46 through address bus 49 (FIG. 3) and is operative to enable one address programming buffer per address operation. Programming is effected through a Zener diode 118 with its cathode coupled to the collectors of the switching transistors 104. The base of the switching transistors 104 is tied to the collector so that the switching transistors 104 are essentially diodes in series with the Nichrome fuses 102. Power input is through a diode 120 from an external terminal to the collectors of all of the transistors 104.

Programming of the switch array is generally accomplished by applying a defined bit pattern to the bit storage cells 100 on at a time through the buffers 112 and "burning in" the cell by applying sufficient current through the selected bit storage cell to evaporate the Nichrome fuse 102 of the selected bit storage cells 100. The binary state of the "burned" bit storage cells 100 is thereby permanently set in an open circuit condition, and the resulting digital bit pattern of opened and closed diodes can be interpreted by the digital-to-analog converters to produce the desired voltage level at the designated voltage-controlled device.

The invention has now been explained with reference to specific embodiments. Other embodiments will be apparent to those of ordinary skill in the art in view of this description. It is therefore not intended that the invention be limited except as indicated by the appended claims.

What is claimed is:

1. An apparatus for use as a hearing aid amplifier comprising:
    a bank of bandpass-restricted channels, each channel having digitally-programmable amplifier means and digitally-programmable compressor means for shaping audio characteristics within each channel, each one of said channels being specific to a unique spectral region, the outputs of said channels being applied to a common output terminal;
    a compact monolithic digital memory means comprising a programmable read only memory (PROM) operative to store binary states in bit storage cells without electrical power input, said binary states being permanently presettable external of said apparatus:
    digital signal lines coupled to each one of said bit cells for use in conveying amplitude values of specified resolution represented by binary states of groups of said bit storage cells to said amplifier means and to said compressor means in each channel to preset parameters of said amplifier means and said compressor means; and
    digital signal applying means coupled to each one of said bit storage cells for directing digital signals originating external of said apparatus to said memory means for use in permanently presetting binary states of said bit storage cells.

2. The apparatus according to claim 1 wherein each one of said amplifier means is a voltage-controlled amplifier, further comprising digital-to-analog converter means coupled to receive signals through said digital signal lines for applying analog representations of said amplitude values to each said voltage-controlled amplifier.

3. The apparatus according to claim 1 wherein said PROM is a fuseable link array having a word size of one bit.

4. The apparatus according to claim 1 wherein said bit storage cells are grouped in sets of unequal word size according to a desired value resolution, and wherein each set is coupled to an individual converting means.

5. The apparatus according to claim 1 or 4 wherein said digital signal applying means comprises a serial shift register having a parallel output of a length corresponding to at least the memory capacity of said memory means and having a single serial binary input means and a plurality of parallel binary output means, said output means being coupled to said digital signal lines.

6. The apparatus according to claim 5 wherein said serial shift register has a further parallel output corresponding to the addressable memory of said memory means.

* * * * *

REEXAMINATION CERTIFICATE (1753rd)
United States Patent [19]
Anderson

[11] B1 4,396,806

[45] Certificate Issued    Jul. 21, 1992

[54] HEARING AID AMPLIFIER

[76] Inventor: Jared A. Anderson, 140 Sunrise Dr., Woodside, Calif. 94052

Reexamination Request:
No. 90/002,440, Sep. 16, 1991

Reexamination Certificate for:
Patent No.: 4,396,806
Issued: Aug. 2, 1983
Appl. No.: 198,677
Filed: Oct. 20, 1980

[51] Int. Cl.⁵ .................................. H04R 25/00
[52] U.S. Cl. .................. 381/103; 381/68.2; 381/68.4; 381/106
[58] Field of Search ............ 330/126, 279; 381/68, 381/68.2, 68.4, 103, 106

[56]   References Cited
U.S. PATENT DOCUMENTS

| | | | |
|---|---|---|---|
| 3,150,327 | 9/1964 | Taylor | 330/126 |
| 3,229,049 | 1/1966 | Goldberg | 381/68.2 |
| 3,479,609 | 11/1969 | Castelli | 330/21 |
| 3,769,606 | 10/1973 | Henegar | 330/66 |
| 3,894,195 | 7/1975 | Kryter | 381/68.2 |
| 3,978,422 | 8/1976 | Rheinfelder | 330/132 |
| 3,989,904 | 11/1976 | Rohrer et al. | 381/68.2 |
| 4,025,721 | 5/1977 | Graupe et al. | 381/47 |
| 4,063,048 | 12/1977 | Kissiah, Jr. et al. | 128/420.6 |
| 4,079,334 | 3/1978 | Hamilton | 330/279 |
| 4,091,236 | 5/1978 | Chen | 381/93 |
| 4,099,035 | 7/1978 | Yanick | 381/68.2 |
| 4,187,413 | 2/1980 | Moser et al. | 381/68 |
| 4,360,787 | 11/1982 | Galpin | 330/279 |

FOREIGN PATENT DOCUMENTS

| | | | |
|---|---|---|---|
| 2737466 | 2/1979 | Fed. Rep. of Germany | 330/279 |
| 149452 | 11/1979 | Japan | 330/279 |

OTHER PUBLICATIONS

Don Jones; The HA-2400 Pram Four Channel Operational Amplifier; Radio-Electronics; vol. 51, No. 3; Mar. 1980; pp. 48–52.

S. Mangold & A. Leijon; "Programmable Hearing Aid with Multichannel Compression"; Scand Audio 8; No. 2; 1979; pp. 121–126.

"Signal Processing to Improve Speech Intelligibility in Perceptive Deafness" by E. Villchur, *The Journal of the Acoustical Society of America*, vol. 53, No. 6, 1973, pp. 1646–1657.

*Primary Examiner*—James L. Dwyer

[57]    ABSTRACT

A general purpose hearing aid amplifier is programmably adaptable to the prescription requirements of the hearing impaired. The hearing aid amplifier comprises a bank of bandpass-restricted channels, each channel having a voltage-controlled input amplifier, a voltage-controlled compressor, and a voltage-controlled output amplifier for shaping the gain attack and delay characteristics of the selected channel. The bank is fed through a fixed high-pass filter from a microphone input, and a mixed output drives a power amplifier for an output transducer such as a hearing aid speaker. The amplifier is programmably adaptable through the use of a monolithic programmable switch array using, for example, semiconductor fuseable link technology to preset digital-to-analog converters voltage controllable levels of the amplifiers and compressors of each channel according to a digital control input. The monolithic switch array is coupled to the programmable amplifiers through digital to analog converters which establish the programming voltages for the amplifiers and compressors. The monolithic switch array digital to analog converters may be constructed on the same monolithic semiconductor chip.

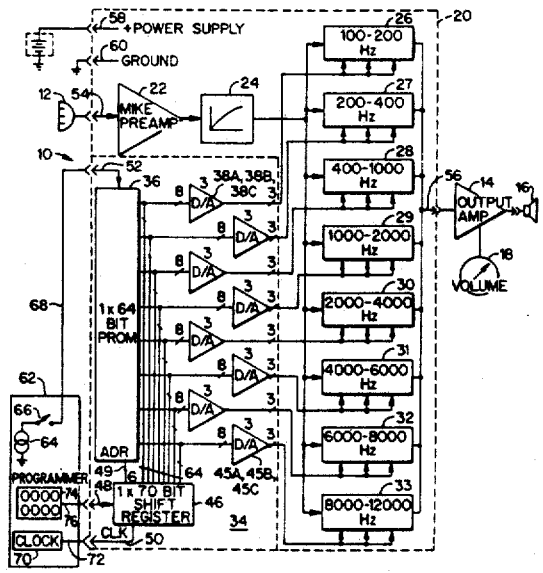

the
REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1, 2 and 3 is confirmed.

Claim 4 is determined to be patentable as amended.

Claims 5 and 6, dependent on an amended claim, are determined to be patentable.

4. The apparatus according to [claim 1] *claim 2* wherein said bit storage cells are grouped in sets of unequal word size according to a desired value resolution, and wherein each set is coupled to an individual *one of said* converting means.

* * * * *

REEXAMINATION CERTIFICATE (3523rd)

United States Patent [19]

Anderson

[11] B2 4,396,806
[45] Certificate Issued Jun. 2, 1998

[54] HEARING AID AMPLIFIER

[75] Inventor: Jared A. Anderson, Woodside, Calif.

[73] Assignee: A & L Ventures I, Orinda, Calif.

Reexamination Requests:
No. 90/003,652, Dec. 5, 1994
No. 90/003,852, Jun. 6, 1995
No. 90/004,246, May 21, 1996
No. 90/004,565, Feb. 26, 1997
No. 90/004,753, Jun. 27, 1997

Reexamination Certificate for:
Patent No.: 4,396,806
Issued: Aug. 2, 1983
Appl. No.: 198,677
Filed: Oct. 20, 1980

Reexamination Certificate B1 4,396,806 issued Jul. 21, 1992

[51] Int. Cl.$^6$ ............................................. H04R 25/00
[52] U.S. Cl. .................... 381/103; 381/106; 381/320; 381/321
[58] Field of Search ...................... 381/68, 68.2, 68.4, 381/98, 103, 106; 364/821, 825, 862; 379/347; 370/7, 123; 455/72; 360/20, 24, 67, 68; 369/45, 58, 91; 367/65, 66, 67; 330/126; 333/14

[56] References Cited

U.S. PATENT DOCUMENTS

| | | |
|---|---|---|
| 4,160,906 | 7/1979 | Daniels et al. . |
| 4,187,413 | 2/1980 | Moser . |
| 4,425,481 | 1/1984 | Mansgold et al. . |

FOREIGN PATENT DOCUMENTS 27 37 466   2/1979   Germany .

OTHER PUBLICATIONS

Mangold et al., "Programmable Hearing Aid With Multichannel Compression", Scand Audiol 8, pp. 121–126, 1979, from the Electronics Research Laboratory, Chalmers University of Technology, and the Department of Audiology, Sahlgren's Hospital, Göteborg, Sweden.

(List continued on next page.)

Primary Examiner—Forester W. Isen

[57] ABSTRACT

A general purpose hearing aid amplifier is programmably adaptable to the prescription requirements of the hearing impaired. The hearing aid amplifier comprises a bank of bandpass-restricted channels, each channel having a voltage-controlled input amplifier, a voltage-controlled compressor, and a voltage-controlled output amplifier for shaping the gain, attack and delay characteristics of the selected channel. The bank is fed through a fixed high-pass filter from a microphone input, and a mixed output drives a power amplifier for an output transducer such as a hearing aid speaker. The amplifier is programmably adaptable through the use of a monolithic programmable switch array using, for example, semiconductor fuseable link technology to preset digital-to-analog converters voltage controllable levels of the amplifiers and compressors of each channel according to a digital control input. The monolithic switch array is coupled to the programmable amplifiers through digital to analog converters which establish the programming voltages for the amplifiers and compressors. The monolithic switch array digital to analog converters may be constructed on the same monolithic semiconductor chip.

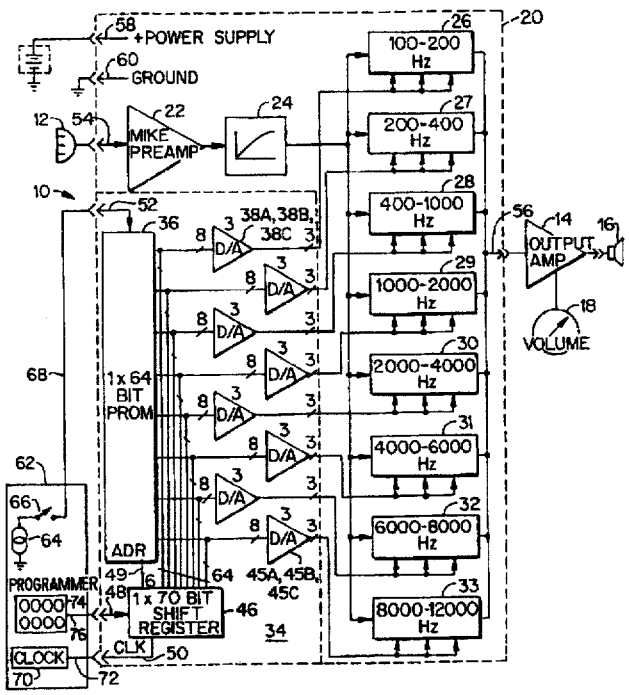

OTHER PUBLICATIONS

Dowle et al., "Digital Processing of Audio Signals In the Development of a Modern Integrated Hearing Aid", IREECON Int'l.:17th Int'l. Electronics Convention & Exhibition, Aug. 27th–31st, 1979, University of New South Wales, Kensington, pp. 290–293.

Mangold, S. and Rissler–Akesson, G. (1977) entitled, "Programmerbart Filter Hjalper Horselskadade", Elteknikk med aktuell electronik 1977:15, pp. 64–66 with accompanying translation from Swedish bearing the title Programmable Filter Helps the Hearing Impaired.

Dowle, R.D., Vaughan, R. and Holmes, W.H. (1979), "Digital processing of audio signals in the development of a modern integrated heraing aid", paper presented at the 17th IREECON Int. Conv. Dig. Int. Electron Conv. 7 Eshib.; University of NSW, Kensington, Sydney, Aug. 27–31, 1979, published by Inst. of Radio & Electron Eng Aust, Sydney, 1979, pp. 290–293.

Mangold, S. and Leijon, A., "Programmable Hearing Aid with Multichannel Compression", *Scan Audiol* 8:121–126, 1979, pp. 121–126.

Levitt, H. et al., "Prescriptive Fitting of Wearable Master Hearing Aids: A Progress Report", *Hearing AIDS Current Developments and Concepts*, pp. 149–159.

Levitt, H., "Methods for the Evaluation of Hearing Aids", Sensorineural Hearing Impairement and Hearing Aids (eds. C. Ludvigsen & J. Barfod) *Scand Audiol Suppl*, 6, 1978, pp. 199–240.

"Report of the Panel on Communicative Disorders to the National Advisory Neurological and Communicative Disorders and Stroke Council", NIH Publication No. 79–1914, Jun. 1, 1979, pp. 1–11.

Graupe, Daniel et al. "Applications of Time Series Identification and Filtering Theory to Hearing Aids", *Hearing Aid Journal*, Oct. 1977, pp. 11; 22–24.

Graupe, Daniel, "Applications of Estimation and Identification Theory to Hearing Aids", Auditory and Hearing Prosthetics Research, Proceedings of conference on Auditory and Hearing Prosthetics Research, University of Wyoming, Laramie Wyoming, Jul. 25–27, 1977, pp. 169–180.

Coln, Michael Christian Wohnsen, "A Computer Controlled Multiband Amplitude Compressor", Department of Electrical Engineering and Computer Science, May 24, 1979, pp. 1–98.

Peterson, Patrick Mangan, "Further Studies of Perception of Amplitude–Compressed Speech by Impaired Listeners", Massachusetts Institute of Technology, Feb. 1980.

Lippmann, R.P., "Study of multichannel amplitude compression and linear amplification for persons with sensorineural hearing loss", Research Laboratory of Electronics, Massachusetts Institute of Technology, J. Acoust. Soc. Am. 69(2), Feb. 1981, pp. 524–534.

Cummins, Kenneth et al, Project Phoenix of Madison, Inc.–Nicolet Audiodiagnostics, "Ambulatory Testing of Digital Hearing Aid Algorithms", Resna '87—Meeting the Challenge, 10th Annual Conference on Rehabilitation Technology—pp. 398–400.

B2 4,396,806

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–6 is confirmed.

* * * * *